US 11,705,214 B2

(12) United States Patent
Fujiwara

(10) Patent No.: US 11,705,214 B2
(45) Date of Patent: Jul. 18, 2023

(54) APPARATUSES AND METHODS FOR SELF-TEST MODE ABORT CIRCUIT

(71) Applicant: MICRON TECHNOLOGY, INC., Boise, ID (US)

(72) Inventor: Yoshinori Fujiwara, Boise, ID (US)

(73) Assignee: Micron Technology. Inc., Boise, ID (US)

(*) Notice: Subject to any disclaimer, the term of this patent is extended or adjusted under 35 U.S.C. 154(b) by 112 days.

(21) Appl. No.: 16/835,051

(22) Filed: Mar. 30, 2020

(65) Prior Publication Data
US 2021/0304835 A1 Sep. 30, 2021

(51) Int. Cl.
*G11C 29/00* (2006.01)
*G11C 29/18* (2006.01)
*G11C 29/50* (2006.01)

(52) U.S. Cl.
CPC ........ *G11C 29/18* (2013.01); *G11C 29/50012* (2013.01)

(58) Field of Classification Search
CPC ....... G11C 8/12; G11C 11/401; G11C 11/406; G11C 11/407; G11C 11/4085; G11C 16/08; G11C 16/26; G11C 16/102; G11C 29/12; G11C 29/18; G11C 29/46; G11C 29/48; G11C 29/50; G11C 29/50004; G11C 29/50012; G11C 29/12015; G11C 5/025
See application file for complete search history.

(56) References Cited

U.S. PATENT DOCUMENTS

| | | | | | |
|---|---|---|---|---|---|
| 4,633,466 A | * | 12/1986 | Laws | ................... | G06F 11/2284 714/E11.163 |
| 5,617,534 A | * | 4/1997 | Balmer | ................... | G06F 11/22 714/36 |
| 5,640,354 A | * | 6/1997 | Jang | ....................... | G11C 29/44 365/201 |
| 6,381,715 B1 | * | 4/2002 | Bauman | ................. | G11C 29/48 365/201 |
| 6,421,789 B1 | * | 7/2002 | Ooishi | .................... | G11C 29/14 714/6.32 |
| 6,658,611 B1 | * | 12/2003 | Jun | .................. | G11C 29/50012 365/201 |
| 6,907,555 B1 | * | 6/2005 | Nomura | ................. | G11C 29/44 714/719 |
| 7,028,240 B1 | * | 4/2006 | Bautista, Jr. | ........... | G11C 29/16 714/733 |
| 7,206,979 B1 | * | 4/2007 | Zarrineh | ................ | G11C 29/16 714/718 |
| 8,689,064 B1 | * | 4/2014 | Lee | ....................... | G11C 29/12 714/719 |
| 9,239,355 B1 | * | 1/2016 | Burstein | ................ | G11C 29/16 |

(Continued)

*Primary Examiner* — Kyle Vallecillo
*Assistant Examiner* — Enamul M Kabir
(74) *Attorney, Agent, or Firm* — Dorsey & Whitney LLP

(57) ABSTRACT

Apparatuses, systems, and methods for self-test mode abort circuit. Memory devices may enter a self-test mode and perform testing operations on the memory array. During the self-test mode, the memory device may ignore external communications. The memory includes an abort circuit which may terminate the self-test mode if it fails to properly finish. For example, the abort circuit may count an amount of time since the self-test mode began and end the self-test mode if that amount of time meets or exceeds a threshold, which may be based off of the expected amount of time for the testing operations to complete.

15 Claims, 6 Drawing Sheets

(56) References Cited

U.S. PATENT DOCUMENTS

| | | | | |
|---|---|---|---|---|
| 9,529,036 B2* | 12/2016 | Balog | | G01R 31/318511 |
| 9,640,279 B1* | 5/2017 | Popps | | G11C 29/4401 |
| 2002/0071325 A1* | 6/2002 | Hii | | G11C 29/16 |
| | | | | 714/E11.169 |
| 2002/0089887 A1* | 7/2002 | Hii | | G11C 29/46 |
| | | | | 714/E11.169 |
| 2002/0194546 A1* | 12/2002 | Ooishi | | G11C 29/12015 |
| | | | | 714/733 |
| 2003/0142566 A1* | 7/2003 | Sohn | | G11C 29/12015 |
| | | | | 365/201 |
| 2003/0177424 A1* | 9/2003 | Ninomiya | | G11C 29/028 |
| | | | | 714/718 |
| 2005/0028050 A1* | 2/2005 | Ganry | | G01R 31/3016 |
| | | | | 714/700 |
| 2005/0043912 A1* | 2/2005 | Kang | | G11C 29/56 |
| | | | | 702/117 |
| 2005/0166111 A1* | 7/2005 | Chien | | G11C 29/38 |
| | | | | 714/733 |
| 2005/0283695 A1* | 12/2005 | Warren | | G01R 31/318552 |
| | | | | 714/734 |
| 2006/0242521 A1* | 10/2006 | Hii | | G11C 29/12015 |
| | | | | 714/733 |
| 2007/0226568 A1* | 9/2007 | Anzou | | G01R 31/31721 |
| | | | | 714/733 |
| 2008/0082884 A1* | 4/2008 | Harada | | G01R 31/31724 |
| | | | | 714/E11.169 |
| 2008/0222464 A1* | 9/2008 | Gorman | | G11C 29/40 |
| | | | | 714/E11.169 |
| 2008/0282121 A1* | 11/2008 | Rajeev | | G11C 29/44 |
| | | | | 714/719 |
| 2009/0319840 A1* | 12/2009 | Hara | | G06F 11/1068 |
| | | | | 714/E11.169 |
| 2013/0223168 A1* | 8/2013 | Taylor | | G11C 29/16 |
| | | | | 365/194 |
| 2014/0365839 A1* | 12/2014 | Iwagami | | G01R 31/31724 |
| | | | | 714/727 |
| 2015/0113331 A1* | 4/2015 | Bhattacharya | | G06F 11/3688 |
| | | | | 714/38.1 |
| 2019/0120945 A1* | 4/2019 | Cai | | G01S 7/51 |
| 2019/0180836 A1* | 6/2019 | Hyun | | G11C 29/028 |
| 2019/0362803 A1* | 11/2019 | Shibata | | G11C 29/1201 |

* cited by examiner

APPARATUSES AND METHODS FOR SELF-TEST MODE ABORT CIRCUIT

BACKGROUND

This disclosure relates generally to semiconductor devices, such as semiconductor memory devices. The semiconductor device may include a variety of circuits, and may generally receive instructions loaded from outside of the semiconductor device. These instructions may be loaded into self-test circuit, which may execute the instructions to perform a sequence of commands on the semiconductor device.

The self-test circuit may execute the instructions to perform one or more testing operations while the device is in a self-test mode. During the self-test mode, to prevent interference, the device may ignore other data and/or commands received by the device. It may be useful to ensure that the self-test mode properly terminates in order to prevent the device from indefinitely ignoring external communications.

DETAILED DESCRIPTION

Figure 1:
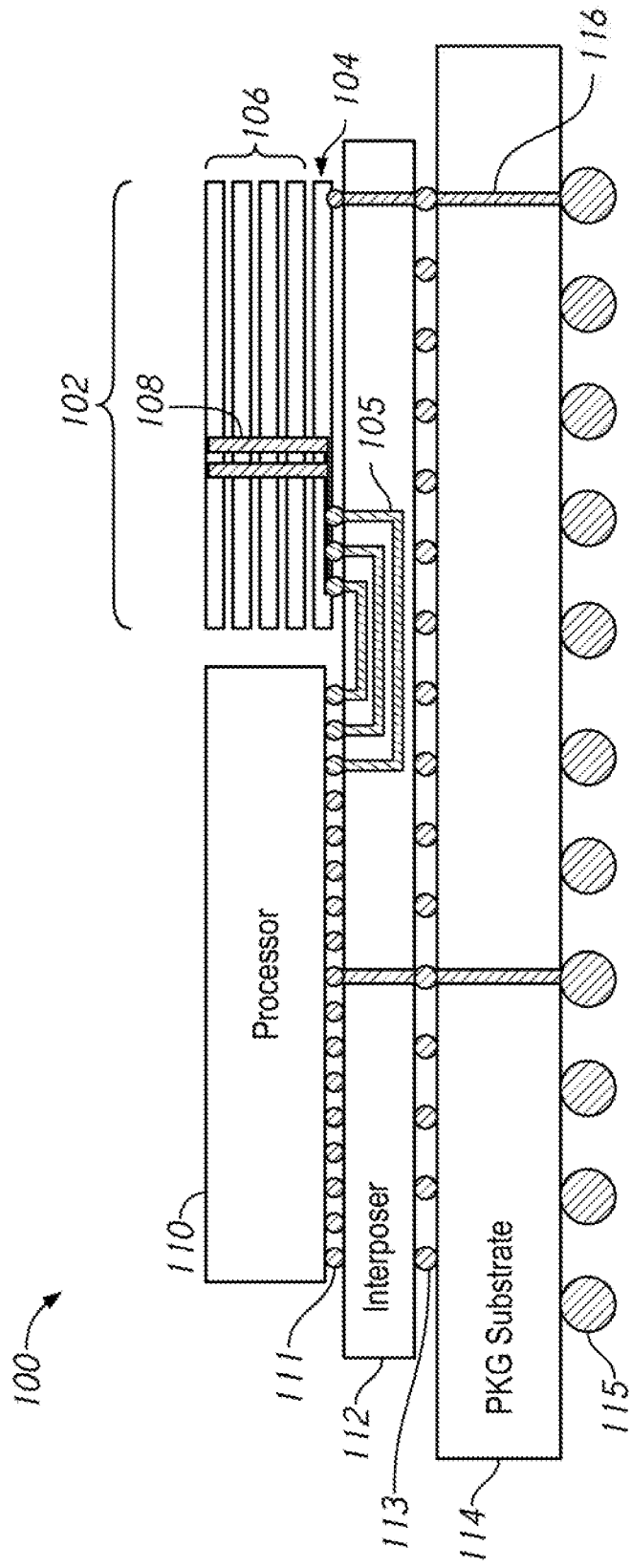
FIG. 1 is a cross-section of a system-in-package (SiP) device according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory devices includes a (generally large) number of memory cells arranged in a memory array at the intersection of word lines (rows) and bit lines (columns). Memory devices may also include a built-in self-test (BIST) circuit, which may be used to check the operation of one or more of the memory cells of the memory array. The BIST circuit may be pre-loaded with instructions for test operations, which may be executed as part of a self-test mode. In an example test operation, the BIST may write test data to one or more memory cells, and then read the test data back from those memory cells. The BIST may compare the read test data to the original data which was written to those cells and generate a result based on that comparison (for example, to report an error if the read and written test data do not match).

During the self-test mode the BIST circuit may generally perform a large number of individual test operations (e.g., a large number of sequential read and write operations). In order to prevent interference with the testing operations, the memory may ignore external communications during the self-test mode. For example, while an internal self-test enable signal is active, the memory device may ignore commands and/or data received at the external terminals of the memory device. During a normal self-test mode, the BIST may perform test operations based on the instructions loaded in the BIST circuit and once the final instruction is completed, may then provide a self-test end signal indicating that the test operations are finished. The self-test end signal may then cause the BIST enable signal to inactivate, indicating that the self-test mode is over and allowing for external communications again. However, some errors may cause the one or more failures in the normal operation(s) of the self-test mode, which may cause the memory device to 'hang' or 'lock', which may prevent it from finishing the final test operation or providing the self-test end signal. Since the device will continue to ignore external commands while in such a state, it may be useful to have an independent method of terminating the self-test mode in the case of an error.

The present disclosure is drawn to apparatuses, systems and methods for a self-test mode abort circuit. A memory device may generate an internal BIST enable signal when it enters a self-test mode. The BIST circuit may begin testing operations when the BIST enable signal is active. The memory may also include an abort circuit which is independent of the BIST circuit. The abort circuit may determine if the self-test mode has failed to properly terminate, and may provide an abort signal, which may cause the device to inactivate the BIST enable signal, ending self-test mode and allowing for external communications. For example, the abort circuit may count an amount of time (e.g., a number of clock cycles) since the self-test began, and may send the abort signal once the amount of time reaches a threshold which is longer than the expected length of testing operations during a normal self-test mode.

FIG. 1 is a cross-section of a system-in-package (SiP) device according to some embodiments of the present disclosure. The SiP device 100 includes a memory device 102 and a processor 110, which are packaged together on a package substrate 114 along with an interposer 112. The memory device 102 may include a self-test circuit, such as a BIST circuit, used to perform tests of the memory device 102.

The memory device 102 as shown in the example of FIG. 1 may be a high bandwidth memory (HBM) device, which includes an interface die (or logic die) 104 and one or more memory core dies 106 stacked on the interface die 104. The memory device 102 includes one or more through silicon vias (TSVs) 108, which are used to couple the interface die 104 and the core dies 106. The processor 110 may act as a host device of the SiP 100.

The processor 110 and the memory device 102 both are coupled to the interposer 112 by a number of micro-bumps 111. Channels 105 through the interposer 112 may couple some of the micro-bumps 111 which are coupled to the processor 110 to respective ones of the micro-bumps 111 which are coupled to the memory device 102 to form an interface between the memory device 102 and processor 110. The interposer 112 may be coupled to the package substrate by one or more bumps such as C4 bumps 113. The package substrate 114 includes bumps 115, some of which are coupled to the processor 110 and some of which are coupled to the memory device 102. Direct access (DA) bumps 116 are coupled through the package substrate 114 and interposer 112 to the interface die 104.

The direct access bumps 116 (e.g., the portion of the bumps 115 which are coupled to the interface die 104) may be organized into a probe pad. In some embodiments, an external device, such as a tester, may be coupled onto the probe pad in order to send and receive signals related to testing operations to and from the memory device 102, without those signals needing to pass to the processor 110. The tester may provide one or more lines of instructions to a self-test circuit of the memory device 102. In some embodiments, a tester may be coupled to processor 110, which may pass the instructions to the self-test circuit. In some embodiments, the processor 110 may generate the instructions and load them into the memory device 102.

Although a particular layout of memory device 102 is described herein (e.g., with an interface die 104 and multiple stacked core dies 106), it should be understood that any layout of memory device may be used as part of the present disclosure. For example, in some embodiments, the memory device may be a single die which includes the components of the interface dies 104 and memory dies 106. In some embodiments, the memory array may be located on the interface die. In some embodiments, the memory device may not be stacked. In some embodiments, components such as the interposer 112 and package substrate 114 may be omitted, and the memory device may not be a SiP device.

Figure 2:
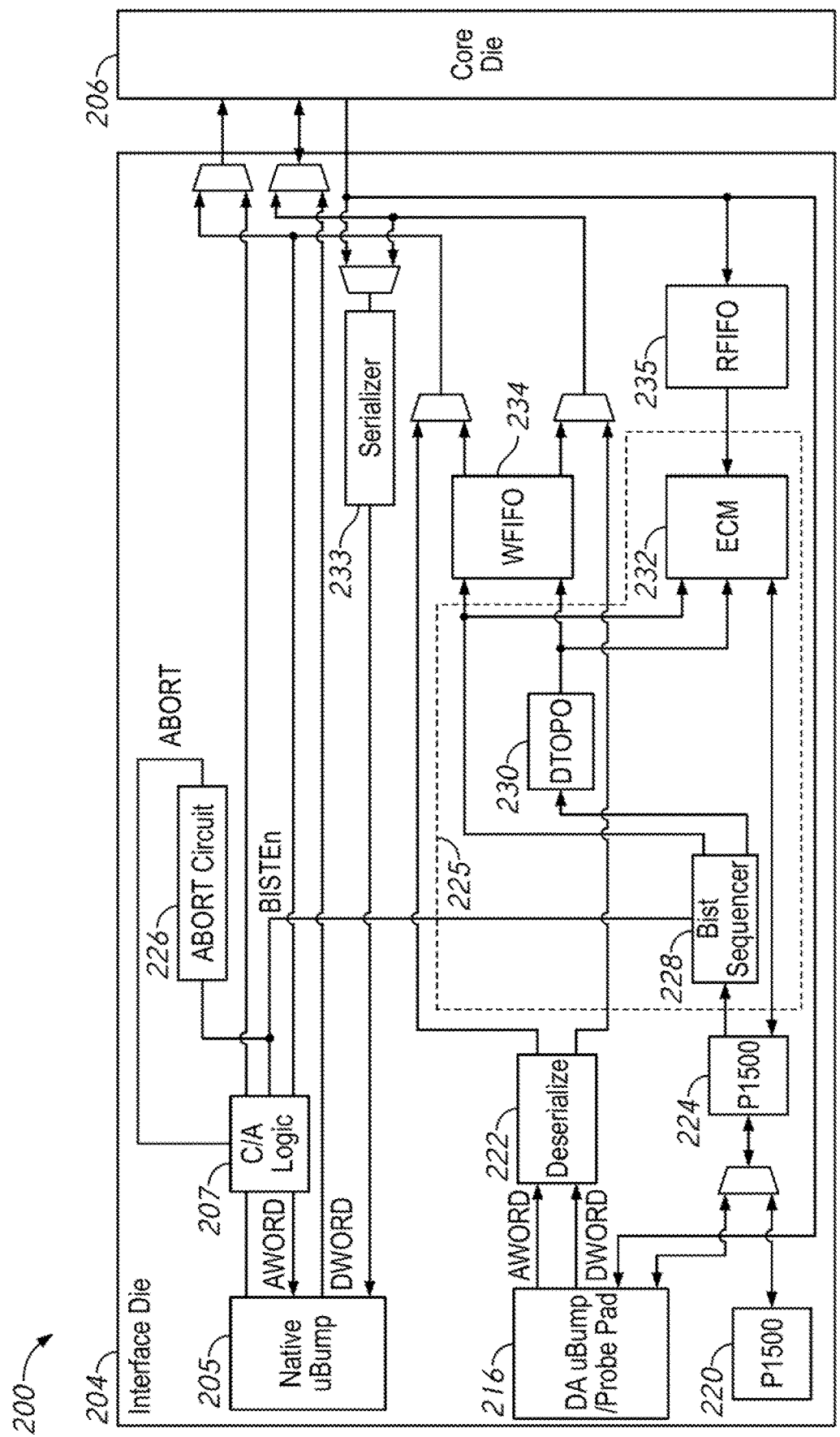
FIG. 2 is a block diagram of a memory device according to an embodiment of the present disclosure.

FIG. 2 is a block diagram of a memory device according to an embodiment of the present disclosure. The memory device 200 may, in some embodiments, be included in the memory device 102 of FIG. 1.

Similar to the memory device shown in FIG. 1, the memory device 200 may be a HBM device, with an interface die 204 and one or more core dies 206. For clarity, only a single core die 206 is shown in FIG. 2, however it should be understood that multiple core dies 206 may be coupled to the interface die 204 (e.g., there may be 3 or 7 core dies 206). Each core die may include a memory array including several memory cells. The interface die 204 may generally act as an interface to write data to or retrieve data from the memory array(s) of the core die/dice 206. The interface die 204 may also be used to perform various other operations such as refreshing memory cells in the core die 206 and/or performing testing operations as part of a self-test mode.

In order to highlight the operation of a self-test procedure, only certain components of the interface die 204 are shown which are involved in the testing process. It should be understood that other components of the interface die 204 which are not shown may be involved in various operations. For example, various components are shown coupled via multiplexers to represent that signals may be routed along different signaling paths. For purposes of clarity, the signals which control these multiplexers as well as the logic circuits which control such routing are not shown. Similarly, certain connections may be omitted for the purposes of clarity (e.g., it may be possible for the P1500 pad 220 and/or direct access pad 216 to access the C/A circuit 207).

The memory device 200 includes three different interface terminals for accessing the core die(s) 206 and/or one or more circuits of the memory, native micro-bumps (uBumps) 205, direct access (DA) uBumps 216, and test interface uBumps 220. The test interface uBumps 220 may be part of a specific interface protocol, such as the IEEE 1500 interface (also referred to as a P1500 interface). In general the test interface uBumps 220 may be referred to as P1500 uBumps 220 (as well as related P1500 operational mode, P1500 circuits etc.), however it should be understood that other test interface protocols may be used in other example embodiments.

The device may have multiple operational modes, which may determine which, if any of the external terminals 205, 216, and/or 220 the memory device 200 is communicating through. For example, after a reset the memory may enter a 'native operation mode' in which communications ae sent and received through the native interface 205. The memory 200 may receive commands which may put it in a direct access (DA) mode, in the memory 200 may generally communicate through the DA terminals 216. During the direct access mode, the circuitry of the interface die 204 may generally be bypassed, so that signals may be sent directly to one or more core die 206. The memory may receive commands which put it a P1500 mode, where communications may be sent and received through the P1500 terminals 220. The P1500 mode may be used to program a BIST sequencer 228 and/or retrieve data from the BIST logic 225.

In the native operation mode the logic die may send and receive information through the native uBumps 205. These native uBumps 205 may, in some embodiments, be included in the uBumps 111 of FIG. 1. The native uBumps 205 may be coupled to a processor (e.g., processor 110 of FIG. 1) via one or more channels (e.g., 105 of FIG. 1). The processor may access information (e.g., to perform read or write operations) in the core die(s) 206 by sending and receiving information through the native uBumps 205. The memory may include command/address logic (C/A logic) 207, which receives the raw signals from the native uBumps 205 and then operates the memory 200 based on those signals. For example the C/A logic 207 may include command and address decoders which may generate one or more internal command signals and/or addresses which may be used to direct operations to specific memory cells. The processor may also use the native uBumps 205 to perform one or more other operations of the memory device 200, such as initiating a refresh mode or a self-test mode of the memory device 200.

In an example access operation as part of the native mode, signals may be received at the native uBumps 205 which requests an access operation such as a read operation on memory cells of one or more of the core dies 206. Based on the received signals, the C/A logic may provide command instructions which indicate a read operation along with an address which specifies the memory cells to be read may be received at the native uBumps 205 as part of a data packet called an 'AWORD'. The AWORD may contain address information, which may indicate which memory cells are to read. For example, each of the core dies 206 may include a memory array, which may include memory cells arranged at the intersection of rows (word lines) and columns (bit lines). The AWORD may contain address information such as a row address, and column address which specify the memory cells at the intersection of one or more rows and columns. The AWORD may also contain additional address information such as a bank address, the address of a particular core die 206 etc. The AWORD may also include command information, such as clock signals used for the timing of operations and commands which indicate if a read or write operation is being performed. Responsive to the address information during a read command, the core die 206 may respond by reading the data from the memory cell(s) specified by the address information and then providing the data as part of a DWORD, which may be provided to the native uBumps 205.

In another example operation of the native mode, information may be received at the native uBumps 205 which requests an access operation such as a write operation, on certain memory cells of one or more of the core dies 206. The C/A circuit 207 may provide an AWORD which specifies a write operation and includes address information for the memory cells to be written to, along with a DWORD which contains the data to be written. The AWORD and DWORD may be provided to the core die 206, which may write the information contained in the DWORD to the memory cells specified by the address information in the AWORD.

In some embodiments, the interface die 204 may include a serializer circuit 233 which is along the path that couples a DWORD out of one of the core dies 206 to the native uBumps 205. In such embodiments, there may be a much larger number of connections between the interface die 204 and core dies 206 than there are native uBumps 205. The serializer circuit 233 may receive information in parallel along a first number of data lines (e.g., from the core 206), and then provide that information in a serial fashion along a second number of data lines (e.g., to the native uBumps 205) which is smaller than the first number.

In some circumstances, it may be desirable to place the memory device 200 into a self-test mode in order to determine one or more characteristics of the memory device 200. The device 200 may include BIST circuits 225, which may be used to perform testing operations as part of a self-test mode. The memory 200 may also include a direct test mode, where test operations are generated by an external device (e.g., a tester) and are conducted on the core die 206 directly through the DA terminals 216.

The P1500 uBumps 220 are coupled to a test interface circuit (e.g., a P1500 circuit) 224, which may interpret signals sent and received using the P1500 signal protocols. For example, the P1500 circuit 224 may translate signals received at the P1500 uBumps into signals usable by other circuits of the memory device 200 and vice versa. In a P1500 operational mode, the memory device 200 may receive signals through the P1500 uBumps 220 and provide those signals to the P1500 circuit 224. Similarly, signals from the memory device 200 may be provided to the P1500 circuit 224, which may then send those signals out of the memory device via the P1500 uBumps 220.

The BIST circuit 225 may include a BIST sequencer 228, which may be programmed with one or more test instructions. For example, BIST sequencer 228 may include an algorithmic pattern generator (APG) which may generate test commands from the test instructions during a self-test mode. For example, the BIST sequencer 228 may be loaded with instructions which cause it to generate a write command to a first address, wait a set amount of time, then increment that address by one, and continue in that manner until a maximum value of the address has been reached. The test instructions may be programmed into the BIST sequencer 228 through the P1500 terminals 220 as part of a P1500 operational mode.

The BIST sequencer 228 may also generate a sequence of test data (e.g., a string of logical bits) to write to memory cells of the core die 206. The BIST sequencer 228 may include a number of registers which may be used to store addresses of memory cells to test as well as a test sequence. Since space in the BIST sequencer 228 may be limited, the test sequence and/or addresses may be generated within the BIST sequencer 228 based on instructions. For example, the BIST sequencer 228 may perform a test on a certain address value, increment that address value by one, and then perform the test again. In some embodiments, to save space in the BIST sequencer 228, the BIST sequencer 228 may load the test sequences into a look-up-table, such as data topology (DTOPO) circuit 230. Each entry in the DTOPO circuit 230 may be associated with a pointer value (e.g., an index value) and in a manner similar to the addresses the BIST sequencer 228 may generate a sequence of pointer values.

The memory device 200 may be entered into a self-test mode, during which the BIST circuit 225 may perform testing operations (e.g., read and write test operations) on the core die 206 based on the previously loaded instructions. For example, the memory may receive an external command (e.g., via the native terminals 205 and/or P1500 terminals) which cause the memory to enter a self-test mode. The memory device 200 may provide a self-test enable signal BISTEn at an active level while in the self-test mode. In some embodiments, the memory 200 may be placed in the self-test mode by commands received over the native terminals 205. In some embodiments, the memory 200 may be placed in the self-test mode by commands received over the P1500 terminals 220. While in the self-test mode, the BIST circuit 225 may perform test operations based on the instructions in the BIST sequencer 228.

During an example write test operation, the BIST sequencer 228 may provide address information (e.g., one or more row and column addresses) and a test sequence (e.g., data to be written to the memory cells specified by the address information) to an input buffer 234. In some embodiments, the BIST sequencer 228 may provide the address information to the input buffer 234, and may provide index information to the DTOPO circuit 230, which may provide the test sequence to the input buffer 234.

The input buffer circuit 234 may be a register, which may store values and then write them to the core die 206. The input buffer circuit 234 may operate as a first-in first-out (FIFO) circuit, and may be referred to as a write FIFO (WFIFO) circuit 234. Based on the address information provided from the WFIFO 234, the test sequence may be written to the memory cells specified by the address information.

During an example read test operation, the BIST sequencer 228 may provide address information to retrieve a test sequence previous stored in the core die 206. Information may be read out from the memory cells specified by the address information to an output buffer circuit 235. The output buffer circuit 235 may generally be similar to the input buffer 234, except that the output buffer 235 receives information from the core die 206 and then provides it on to other circuits of the interface die 204. The output buffer 235 may be a read FIFO (RFIFO) circuit 235.

An error catch memory (ECM) circuit 232 may be used to generate result information based on the read test sequence. The ECM circuit 232 may be coupled to the address information and test sequences provided to the input buffer 234, and more include one or more registers used to store the written test sequences as well as address information about which memory cells the test sequence was written to. When a read operation is performed, the ECM circuit 232 may compare the read test sequence from the output buffer 235 to the test sequence which was written to those memory cells as part of an earlier write operation, and may generate result information based on that comparison. The ECM circuit 232 may then provide the result information (e.g., which memory cells failed, as part of what test, etc.) to the P1500 circuit 224, which may then provide the result information out of the memory over the P1500 uBumps.

While the device is in the self-test mode (e.g., while the BISTEn signal is active), to prevent interference with the test operations, the memory 200 may ignore communications along the input terminals 205, 216, and 220. When the BIST circuit 225 is done performing the test operations, and is ready to provide results from the ECM circuit 232, the BIST circuit 225 may signal that it has finished. The memory 200 may then exit the self-test mode (e.g., by returning the signal BISTEn to an inactive level). As described in more detail herein, the memory 200 may also include an abort circuit 226, which may independently be used to exit the memory 200 from the self-test mode. For example, the abort circuit 226 may track an amount of time the memory 200 has been in the self-test mode, and may provide a signal ABORT when the time exceeds a threshold. Responsive to the signal ABORT, the memory 200 may exit the self-test mode. In some embodiments, an error report may be generated if the signal ABORT is used.

As well as the native mode and the P1500 mode, the memory device 200 may also be entered into a DA mode. In some scenarios it may be desirable to bypass other components of a SiP package (e.g., such as the processor 110 of FIG. 1) to directly send and receive signals from the memory device 200. While the device is in one of the DA modes, signals may be sent and received along the DA uBumps 216, which may bypass other components of the SiP to and allow an external device (e.g., a tester circuit, a probe) to directly send and receive signals from the memory device 200. This may involve activating a DA enable signal. For example, one of the DA uBumps 216 may be used as a DA enable pin, and when a DA enable signal, such as a logical high, is received at the DA enable pin, the memory may transition to the DA1500 mode. In the DA direct mode, the memory device 200 may be operated in a manner analogous to the native mode, except the information is provided along the DA uBumps 216 instead of the native uBumps 205.

For example, in the DA direct mode, the DA uBumps 216 may receive (and/or provide) AWORDs and DWORDs in a manner similar to the native mode. In some embodiments, there may be less DA uBumps 216 than there are native uBumps 205. In order to mimic the operation of signals along the native uBumps 205, a deserializer circuit 222 may be used. The deserializer circuit 222 may receive the AWORD and DWORD from the DA uBumps 216 and then split the received serial data into a number of parallel channels. In some embodiments, the deserializer circuit 222 may split the AWORD and DWORD into a number of parallel channels to mimic the number of channels that the AWORD and DWORD are received along by the native uBumps 205.

In the DA direct mode, AWORDs and DWORDs may be received at the DA uBumps 216, provided to the deserializer circuit 222, and then provided to the core die(s) 206. Similarly, in the DA direct mode, AWORDs and DWORDs may be provided from the core die 206 to the DA uBumps. In this manner, while in the DA direct mode, the memory device 200 may be operated through the DA uBumps in a manner analogous to the way the memory 200 would be operated through the native uBumps 205 in the native mode.

Figure 3:
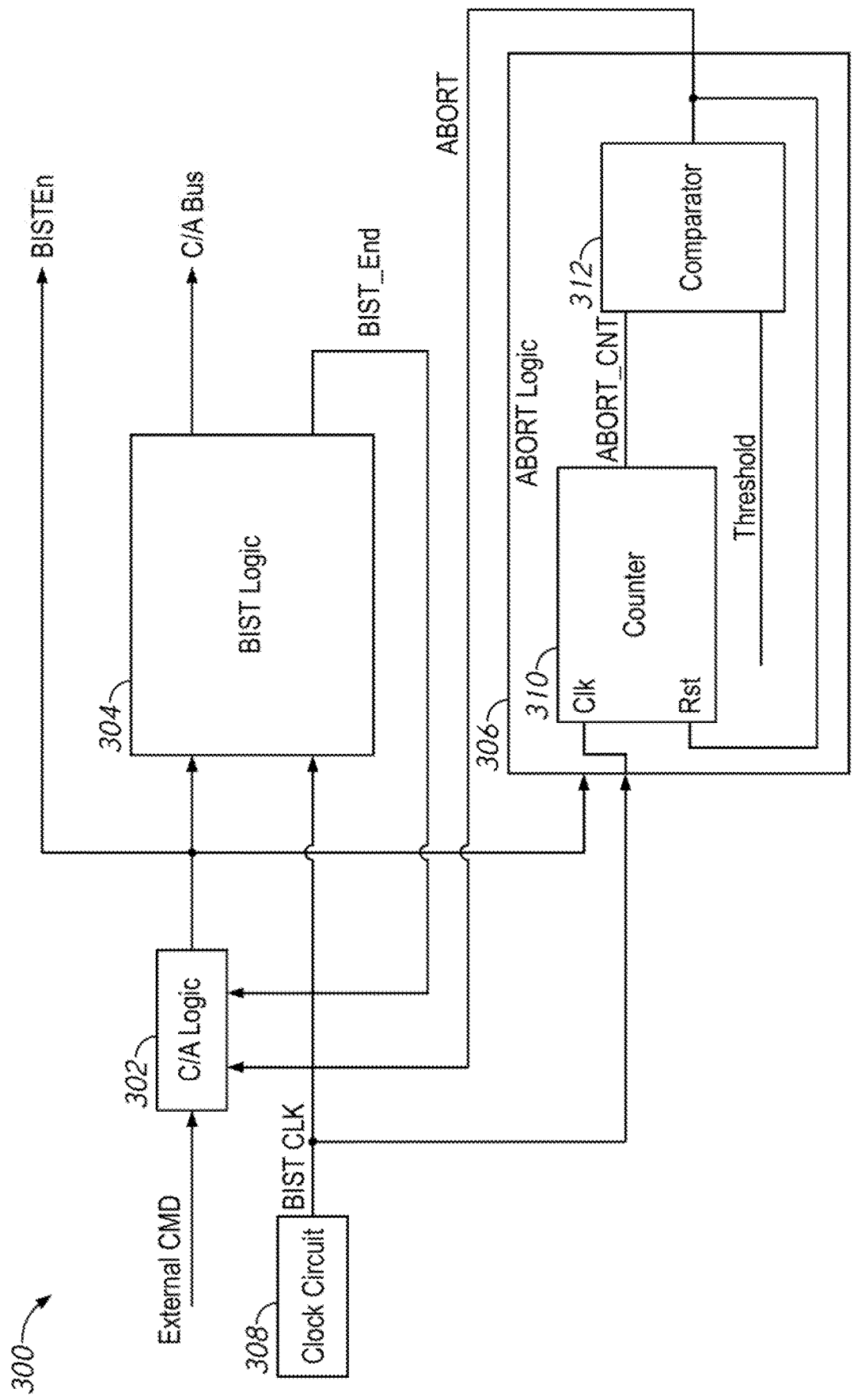
FIG. 3 is a block diagram of testing and abort circuits according to some embodiments of the present disclosure.

FIG. 3 is a block diagram of testing and abort circuits according to some embodiments of the present disclosure. FIG. 3 shows a portion 300 of a memory device, which in some embodiments may be included in the interface die 104 of FIG. 1 and/or memory device 200 of FIG. 2. The portion 300 is a simplified view of circuits and signals which may be used to activate and stop a self-test mode. For purposes of clarity, certain components and operations which were described in FIGS. 1-2 have been omitted in FIG. 3.

The portion 300 includes a BIST logic circuit 304. The BIST logic circuit 304 may include various components which are used to perform testing operations. The BIST logic circuit 304 may, in some embodiments, be included in the BIST circuit 225 of FIG. 2. When the BIST logic circuit 304 receives an enable signal BISTEn at an active level (e.g., a high logical level), the BIST logic circuit 304 may perform a test operation. For example, the BIST logic circuit 304 may be programmed to write one or more patterns of data to various memory cells, read data from those memory cells, and compare the written and read information. This process may be relatively time consuming. For example, the testing operation may take about 10 seconds. Other lengths of testing operation may be used in other examples.

The portion 300 includes a C/A logic circuit 302. The C/A logic circuit 302 may represent various circuits of the memory which are involved in the timing and operations of the memory. For example the C/A logic circuit 302 may include input/output circuits, control logic, refresh circuitry, etc. The C/A logic circuit 302 receives external commands, such as through one or more external terminals (e.g., through the native terminals 205 of FIG. 2 and/or P1500 terminals 220 of FIG. 2). The C/A logic circuit 302 may receive an external command, or otherwise decide, that memory 300 should enter a self-test mode. To indicate the start of the self-test mode, the C/A logic circuit 302 may begin providing the BIST enable signal BISTEn at an active level.

To prevent interference with the test operations, the C/A logic circuit 302 may ignore external commands while the enable signal BISTEn is active. For example, the C/A logic circuit 302 may receive a first external command which instructs it to begin the self-test mode. The C/A logic circuit 302 may begin providing the signal BISTEn at an active level. While BISTEn is at an active level, the C/A logic circuit 302 may receive a second external command (e.g., to read data from one or more memory cells). However, since the signal BISTEn is active, the C/A logic circuit 302 may ignore the second external command.

The portion 300 may also include a clock circuit 308. The clock circuit 308 may provide a BIST clock signal BIST_CLK. In some embodiments, the clock signal BIST_CLK may be based on a system clock, such as a clock CLK of the memory device. The clock signal BIST_CLK may be a periodic signal (e.g., alternating between high and low logical levels) with predictable timing. The clock signal BIST_CLK may be used to control the timing of the testing operations. In some embodiments, the clock circuit 308 may also receive the enable signal BISTEn, and may only provide the clock signal BIST_CLK when the enable signal BISTEN is active.

The BIST logic 304 may be activated by the BIST enable signal BISTEn being at an active level, and may perform a testing operation once activated. The BIST circuit 304 may be loaded with one or more testing instructions. With timing based on the BIST clock BIST_CLK, the BIST logic 304 may begin executing those instructions while the BIST enable signal BISTEn is at an active level. For example, the instructions may cause the BIST circuit 304 to perform test operations such as reading or writing information along a command/address C/A bus to the memory core dies. Once the BIST logic circuit 304 finishes executing the stored instructions, the BIST logic circuit 304 may provide a BIST end signal BIST_End at an active level (e.g., a high logical level). The C/A logic 302 may receive the signal BIST_End, and responsive to the signal BIST_End at an active level, may inactivate the BIST enable signal (e.g., by providing the signal BISTEn at a low logical level).

There may be some scenarios where the BIST circuit 304 fails to properly provide the end signal BIST_End. For example, the BIST circuit 304 may encounter an internal error which causes it to 'hang' or 'freeze' while executing one or more of the lines of instruction. Since the BIST circuit 304 may provide the end signal BIST_End at an active level when it reaches an end of the instructions, if the BIST circuit 304 does not reach the end of the instructions, it may fail to properly provide the BIST_End signal. There may be other reasons for the BIST circuit 304 to properly provide the end signal BIST_End in other examples.

To prevent the testing condition from continuing indefinitely when the BIST circuit 304 fails to properly provide the end signal BIST_End, the memory may also include an abort logic circuit 306. The abort logic circuit 306 may represent an independent pathway which may be used to stop the testing operation if the BIST logic circuit 304 fails to properly provide the end signal BIST_End. The abort logic circuit 306 may use one or more conditions to determine if the BIST logic circuit 304 has failed to properly provide the end signal BIST_End, and if it has, provide a signal ABORT at an active level. Responsive to the signal ABORT being at an active level, the C/A logic 302 may inactivate the enable signal BISTEn, which may stop the test operation and may cause the C/A logic 302 to begin receiving commands from the external terminals again.

In some embodiments, the abort logic circuit 306 may use an expected completion time of the testing operation to determine when to provide the ABORT signal at an active level. For example, the abort logic circuit 306 may count the time elapsed since the testing operation began, and may provide the signal ABORT at an active level once the elapsed time passes a threshold. The threshold may be based on an expected amount of time to perform the testing operation, plus some amount of buffer time to allow for variations in the run time of the testing operation.

In order to track the elapsed time, the abort logic circuit 306 may include a counter circuit 310, which may count time based on the BIST clock BIST_CLK. For example, the counter circuit 310 may change (e.g., increment) a count value ABORT_CNT each time a rising edge of the BIST_CLK is received. The abort logic circuit 306 may include a comparator circuit 312 which compares the count value ABORT_CNT to a threshold value Threshold. The threshold value may be stored on the memory 300 (e.g., in a register of the abort logic 306, in a mode register of the memory 300) or may be 'hardwired' into the ABORT logic 306. In some embodiments, the threshold value may be determined based on the instructions loaded into the BIST logic circuit 304 for self-testing (e.g., based on a number of test operations). In some embodiments, the threshold value may be loaded into the memory along with the test instructions.

When the count value ABORT_CNT matches or exceeds the threshold value, the signal ABORT may be provided at an active level by the comparator circuit 312. Responsive to the ABORT signal being at an active level (or, in some embodiments, responsive to the signal BISTEn falling to an inactive level), the count value may be reset (e.g., to 0). In some embodiments, the counter may begin counting when the signal BISTEn becomes active. In some embodiments, the clock signal BIST_CLK may only be provided when BISTEn is active, and the counter may count all rising edges of the BIST_CLK.

Figure 4:
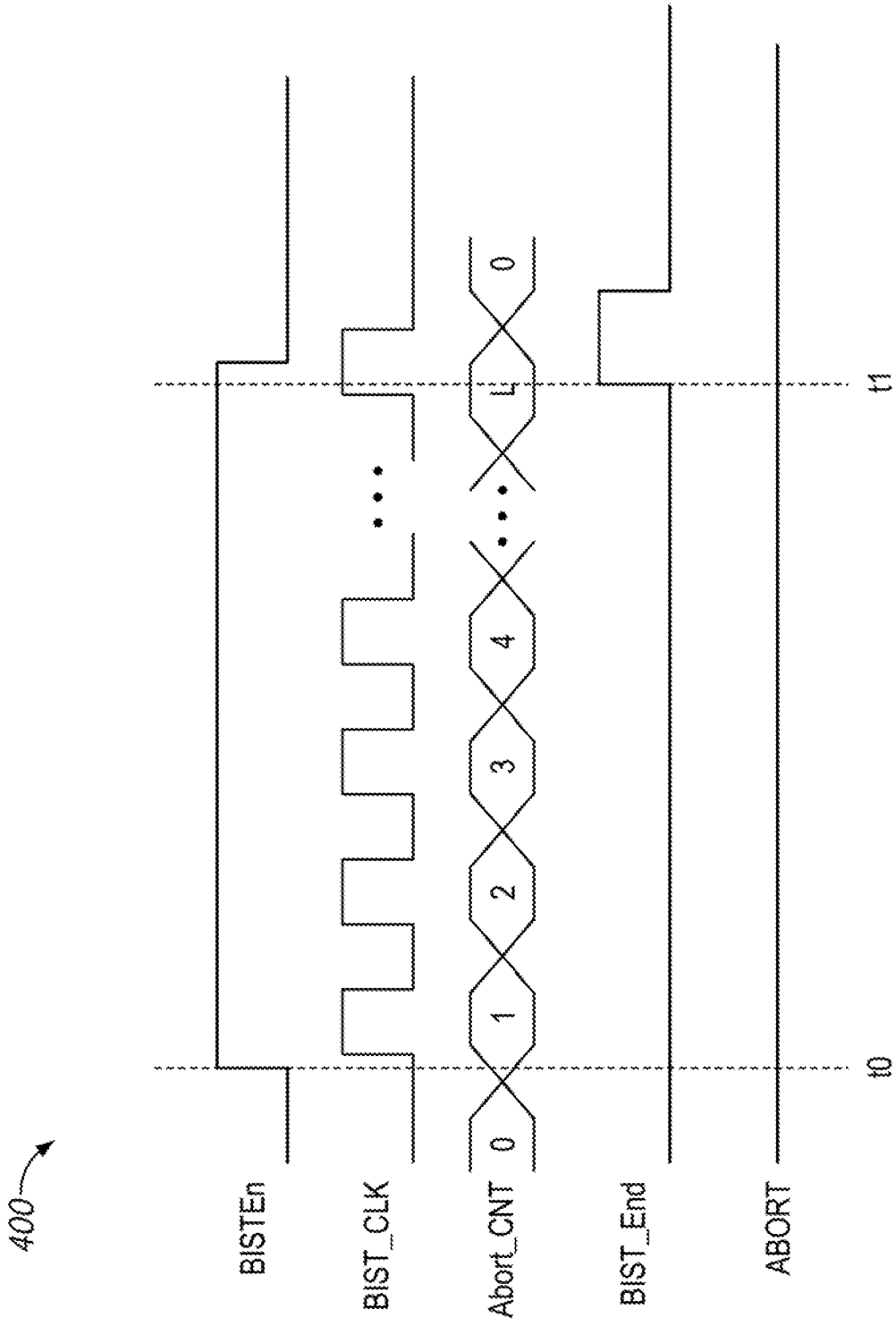
FIG. 4 is a timing diagram of signals during a testing operation where a test end signal is properly provided according to some embodiments of the present disclosure.

FIG. 4 is a timing diagram of signals during a testing operation where a test end signal is properly provided according to some embodiments of the present disclosure. FIG. 4 shows a timing diagram 400 of operations in a memory device, such as the portion 300 of the memory device of FIG. 3. In particular, the timing diagram 400 shows the operation of a memory under conditions where the BIST circuit properly sends an end signal.

At an initial time t0, the signal BISTEn rises to an active level to indicate that a testing operation should begin. In the embodiment of FIG. 4, the clock signal BIST_CLK is tied to the enable signal, so shortly after t0, the clock signal BIST_CLK begins oscillating. Responsive to a rising edge of the clock signal BIST_CLK, a counter in the abort circuit may increment. The counter may increment for each rising edge of the clock signal BIST_CLK while the enable signal BISTEn is active. Each time the counter increments, it may compared to a threshold value, which in this case is a number 'N', to determine if the ABORT signal should be provided at an active level or not.

At a first time t1, the testing operation may end (e.g., because the BIST circuit reached the end of its instructions) and the BIST circuit may provide the signal BIST_End at an active level. At this point, the abort counter value is a number L, which is less than the threshold count N. Accordingly, the signal ABORT has remained at an inactive level. The signal BIST_End being at an active level may cause the signal BISTEn to be provided at an inactive level, which in turn may reset the value of the abort counter.

Figure 5:
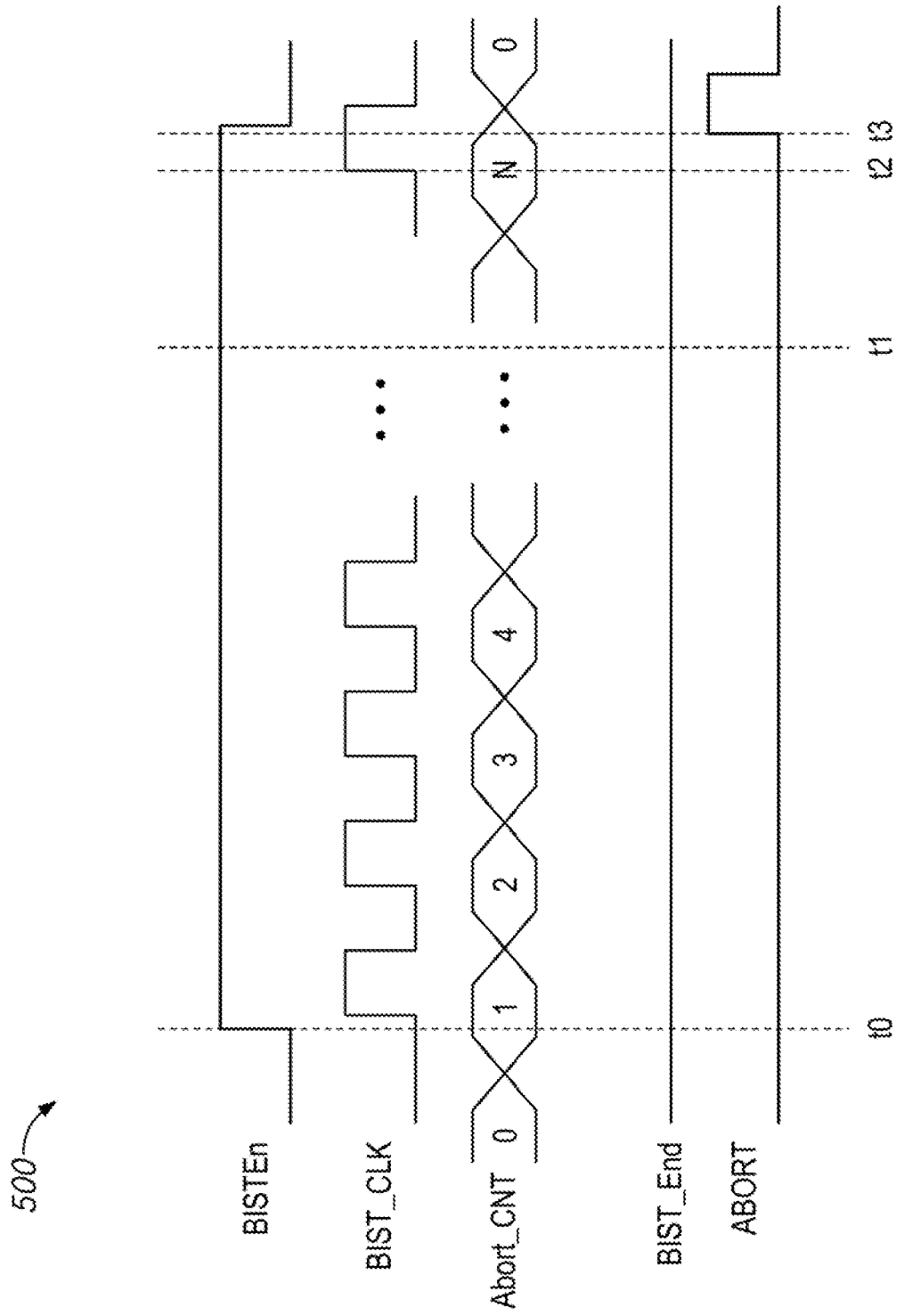
FIG. 5 is a timing diagram of signals during a testing operation where a test end signal is not properly provided according to some embodiments of the present disclosure.

FIG. 5 is a timing diagram of signals during a testing operation where a test end signal is not properly provided according to some embodiments of the present disclosure. The timing diagram 500 of FIG. 5 may generally be similar to the timing diagram of FIG. 4, except that in the timing diagram of FIG. 5, the BIST circuit freezes and does not properly provide the BIST_End signal at an active level. For the sake of brevity, features and signals which are similar to those already described with respect to FIG. 4 will not be described again with respect to FIG. 5.

At a first time t1, which may be the same first time t1 as the timing diagram 400 of FIG. 4, it may be expected that the testing operation would have ended. However, in the timing diagram 500, the signal BIST_End remains inactive at the time t1. Accordingly, the enable signal BISTEn may remain active after t1 and the clock signal BIST_CLK may continue to be provided. At a second time t2, the abort counter may reach the value N, which is the threshold value of the abort logic circuit. Since the count value N matches the threshold value, at the time t3, the abort circuit may begin providing the signal ABORT at an active level. Responsive to the signal ABORT at an active level, the signal BISTEn may be provided at an inactive level. This may reset the abort counter and also cause the signal ABORT to fall to an inactive level. This may end the self-test mode and reset the self-test circuit, which allows for normal operations to continue, even though the BIST circuit did not indicate that the test operation had finished.

Figure 6:
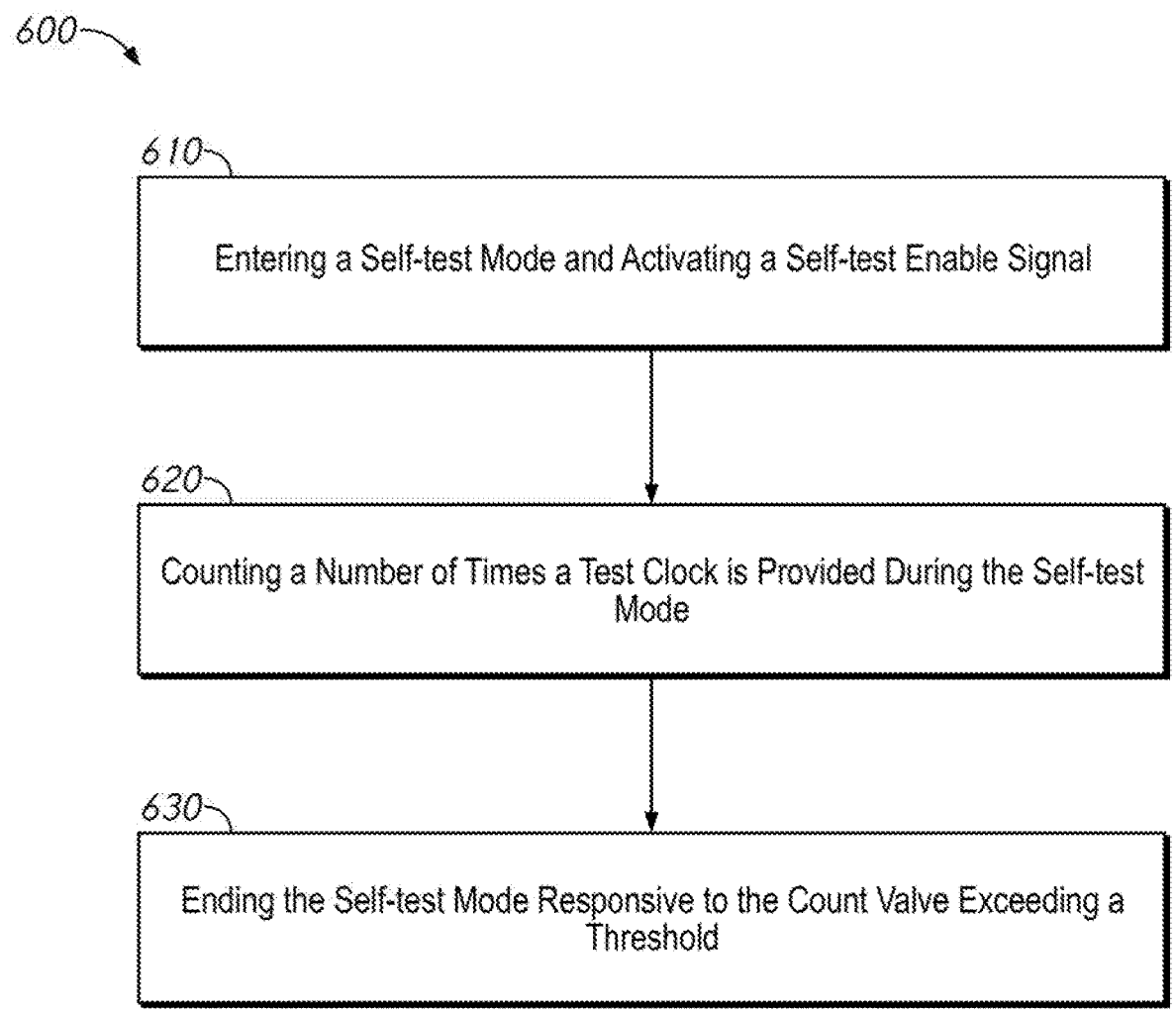
FIG. 6 is a flow chart of a method of aborting a testing operation according to some embodiments of the present disclosure.

FIG. 6 is a flow chart of a method of aborting a testing operation according to some embodiments of the present disclosure. The method 600 may, in some embodiments, be implemented using one or more of the circuits described in FIGS. 1-3.

The method 600 may generally begin with block 610, which describes entering a self-test mode and activating a self-test enable signal. For example a memory device may include one or more self-test circuits, such as a built-in self-test (BIST) circuit (e.g., 225 of FIG. 2 and/or 304 of FIG. 3). In some embodiments, the memory device may receive an external command which puts the device in the self-test mode. In some embodiments, the memory device may include internal logic which instructs it to begin a self-test operation by entering the self-test mode. The BIST circuit may be loaded with one or more instructions which may contain instructions for one or more test operations. During the self-test mode, the BIST circuit may perform one or more test operations based on the instructions. For example, the BIST circuit may write test data to memory cells of a memory array, read the data from those memory cells, and then compare the written and read data. The BIST circuit may generate a results file based on the testing results.

Block 610 generally be followed by block 620, which describes counting a number of times a test clock is provided during the self-test mode. The test clock may be used to control a timing of the test operations performed as part of the self-test mode. In some embodiments, the test clock may be activated by the self-test enable signal, and the test clock may only be provided while the self-test enable signal is active. In some embodiments, the test clock may be provided regardless of the self-test enable signal. An abort circuit of the memory device (e.g., abort circuit 306 of FIG. 3) may include a counter which counts the test clock. For example, the counter may increment a count value responsive to each rising edge of the clock signal. Each time the count value is updated, a comparator circuit may compare the count value to a threshold value.

Block 620 may generally be followed by block 630, which describes ending the self-test mode responsive to the count value exceeding a threshold. In some embodiments, the self-test mode may be ended responsive to the count value meeting or exceeding the threshold. When the comparator in the abort circuit determines that the count value meets/exceeds the threshold, an ABORT signal may be provided at an active level. Responsive to the ABORT signal at the active level, the self-test enable signal may be returned to an inactive level. In some situations, the BIST circuit may reach an end of testing operations and may provide a self-test end signal at an active level. Responsive to the self-test end signal at an active level, the self-test enable signal may be returned to the inactive level. Responsive to the self-test enable signal falling to the inactive level, the counter may be reset (e.g., to 0). While the self-test enable signal is active, the memory device may ignore external signals. Responsive to the self-test enable signal becoming inactive, the memory device may begin responding to external signals again. In some embodiments, if the ABORT signal is provided at an active level (e.g., because the self-test end signal was provided at a proper time), the BIST circuit may generate an error report such as an error code or error flag.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus, comprising:
a command/address (C/A) circuit configured to provide an internal command signal and an address during a native operation mode and a self-test enable signal at an active level during a self-test mode;
a clock circuit configured to provide a self-test clock signal responsive to the self-test enable signal at an active level provided by the C/A circuit;
a self-test circuit configured to perform testing operations on a memory array responsive to the self-test enable signal at an active level provided by the C/A circuit and based on address information and a test sequence for the testing operations provided by a self-test sequencer; and
an abort circuit configured to:
change a count value responsive to the self-test clock signals; and
provide an abort signal when the count value matches or exceeds a threshold, the threshold longer than an expected length of the testing operations, wherein
the C/A circuit is further configured to stop providing the self-test enable signal at the active level responsive to the abort signal, and
the abort circuit includes a counter configured to change the count value responsive to each rising edge of the self-test clock signal.

2. The apparatus of claim 1, wherein the command/address circuit is further configured to ignore external commands while the self-test enable signal is at the active level.

3. The apparatus of claim 1, wherein the threshold is based on an expected completion time of the self-test mode.

4. The apparatus of claim 1, wherein the counter is further configured to increment the count value responsive to each rising edge of the self-test clock signal.

5. The apparatus of claim 4, wherein the counter is configured to reset the count value responsive to the self-test enable signal becoming inactive.

6. The apparatus of claim 1, wherein
the self-test circuit is further configured to provide a self-test end signal at an active level upon finishing the one or more testing operations, and
the command/address circuit is further configured to provide the self-test enable signal at an inactive level responsive to the self-test end signal at the active level.

7. A method, comprising:
providing an internal command signal and an address during a native operation mode by a command/address (C/A) circuit;
providing a self-test enable signal during a self-test mode by the command/address (C/A) circuit;
entering a self-test mode of a memory device and activating the self-test enable signal;

providing a self-test clock signal by a clock circuit responsive to the self-test enable signal at an active level provided by the C/A circuit;

performing testing one or more operations on a memory array of the memory device during the self-test mode responsive to the self-test enable signal at an active level provide by the C/A circuit and based on address information and a test sequence for the testing operations provided by a self-test sequencer;

counting, by an abort circuit, a number of times the self-test clock signal is provided during the self-test mode;

changing a count value responsive to each rising edge of the self-test clock signal by a counter of the abort circuit; and providing an abort signal to end the self-test mode responsive to the count value meeting or exceeding a threshold by the abort circuit, the threshold longer than an expected length of the test operations.

8. The method of claim 7, further comprising:
ending the self-test mode when the one or more test operations are complete.

9. The method of claim 8, further comprising loading instructions into a self-test circuit of the memory device, wherein
the one or more test operations are performed based on the loaded instructions.

10. The method of claim 7, further comprising determining a value of the threshold based on an expected duration of one or more test operations during the self-test mode.

11. The method of claim 7, further comprising ignoring external commands to the memory device while the self-test enable signal is active.

12. An apparatus, comprising:
a memory array; and
an interface die configured to:
  enter a self-test mode responsive to a self-test enable signal at an active level and perform at least one test operation on the memory array based on address information and a test sequence for the test operation; and
  exit the self-test mode a first amount of time after entering the self-test mode if the self-test mode has not ended before the first amount of time has elapsed, wherein
the interface die comprises:
  a self-test sequencer configured to provide the address information and the test sequence for the test operation;
  a command/address (C/A) circuit configured to provide an internal command signal and an address during a native operation mode and the self-test enable signal at an active level during the self-test mode;
  a clock circuit configured to provide a self-test clock signal responsive to the self-test enable signal at an active level provided by the C/A circuit; and
  an abort counter configured to:
    count the self-test clock during the self-test mode;
    change a count value responsive to each rising edge of the self-test clock by a counter of the abort counter; and
    provide an abort signal to end the self-test mode when the count value matches or exceeds a threshold, the threshold longer than an expected length of the testing operation.

13. The apparatus of claim 12, wherein the self-test mode is expected to end after a second amount of time shorter than the first amount of time.

14. The apparatus of claim 13, wherein the first amount of time is based on the second amount of time.

15. The apparatus of claim 12, wherein the interface die is configured to ignore external commands during the self-test mode.

* * * * *

UNITED STATES PATENT AND TRADEMARK OFFICE
CERTIFICATE OF CORRECTION

PATENT NO. : 11,705,214 B2
APPLICATION NO. : 16/835051
DATED : July 18, 2023
INVENTOR(S) : Yoshinori Fujiwara It is certified that error appears in the above-identified patent and that said Letters Patent is hereby corrected as shown below:

In the Claims

| | Reads | Should Read |
|---|---|---|
| Column 12, Line 32 | responsive to the self-test clock signals; | responsive to the self-test clock signal; |

Signed and Sealed this
Seventeenth Day of October, 2023

Katherine Kelly Vidal
*Director of the United States Patent and Trademark Office*